(12) United States Patent
Wong et al.

(10) Patent No.: US 8,077,816 B2
(45) Date of Patent: Dec. 13, 2011

(54) FAST PREDICTIVE AUTOMATIC GAIN CONTROL FOR DYNAMIC RANGE REDUCTION IN WIRELESS COMMUNICATION RECEIVER

(75) Inventors: Ian C. Wong, Austin, TX (US); Leo G. Dehner, Austin, TX (US); James W. McCoy, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 1047 days.

(21) Appl. No.: 11/849,551

(22) Filed: Sep. 4, 2007

(65) Prior Publication Data

US 2009/0060102 A1 Mar. 5, 2009

(51) Int. Cl.
*H04L 27/08* (2006.01)

(52) U.S. Cl. ........ 375/345; 375/340; 375/260; 455/101; 455/232.1; 381/107; 341/118; 330/279

(58) Field of Classification Search .................. 375/345, 375/340, 260; 455/101, 232.1; 381/107; 341/118; 330/279
See application file for complete search history.

(56) References Cited

U.S. PATENT DOCUMENTS

| | | | |
|---|---|---|---|
| 5,241,316 A * | 8/1993 | Pringle | 342/62 |
| 6,263,029 B1 * | 7/2001 | Alard et al. | 375/340 |
| 6,445,732 B1 | 9/2002 | Beamish et al. | |
| 6,498,927 B2 | 12/2002 | Kang et al. | |
| 6,563,891 B1 * | 5/2003 | Eriksson et al. | 375/345 |
| 6,748,200 B1 | 6/2004 | Webster et al. | |
| 6,766,153 B2 * | 7/2004 | Kozak et al. | 455/232.1 |
| 6,973,134 B1 | 12/2005 | Jones, IV et al. | |
| 7,218,258 B2 * | 5/2007 | Delanghe et al. | 341/118 |
| 7,501,895 B2 * | 3/2009 | Yang | 330/279 |
| 7,616,718 B2 * | 11/2009 | Sato | 375/345 |
| 2004/0157567 A1 * | 8/2004 | Jootar et al. | 455/101 |
| 2006/0210096 A1 * | 9/2006 | Stokes et al. | 381/107 |
| 2006/0222094 A1 * | 10/2006 | Makhlouf et al. | 375/260 |

* cited by examiner

*Primary Examiner* — David C. Payne
*Assistant Examiner* — Zewdu Kassa
(74) *Attorney, Agent, or Firm* — Gary R. Stanford

(57) ABSTRACT

A method of fast predictive automatic gain control is disclosed including estimating channel gain applied to a received signal, predicting channel gain at a subsequent time by applying temporal correlation statistics to the estimated channel gain, determining a predicted receiver gain which reduces variance between the predicted channel gain and a predetermined target power level, and applying the predicted receiver gain to the received signal. The method may include applying linear minimum mean-squared error prediction to the estimated channel gain. The method may include predicting error variance at the subsequent time by applying the temporal correlation statistics to the estimated channel gain and combining the predicted channel gain and the predicted error variance. The method may include estimating channel gain of known pilot symbols, estimating a temporal correlation function using the estimated channel gain, and determining predicted channel gain using the estimated channel gain and the estimated temporal correlation function.

19 Claims, 4 Drawing Sheets

Figure 1:
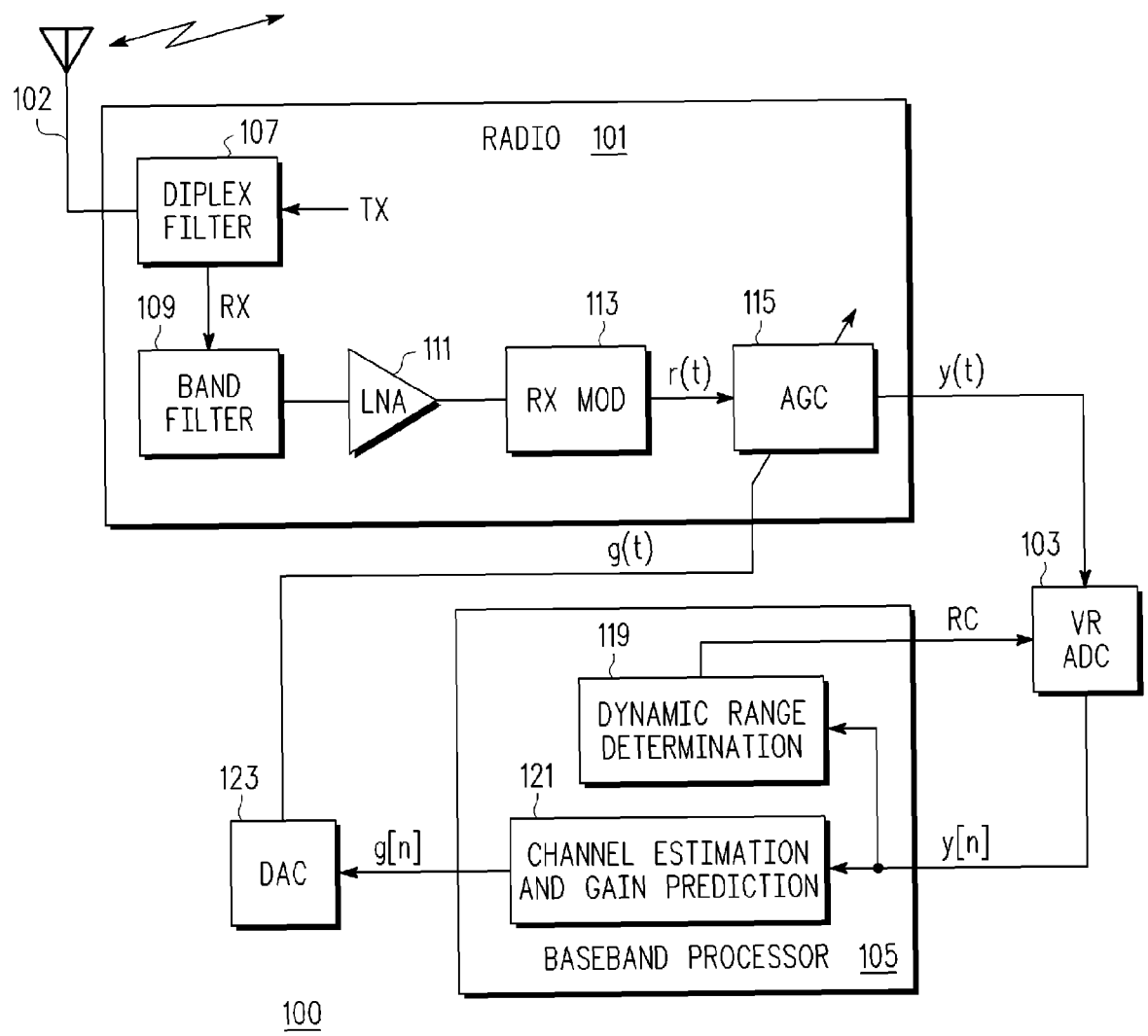
Figure 2:
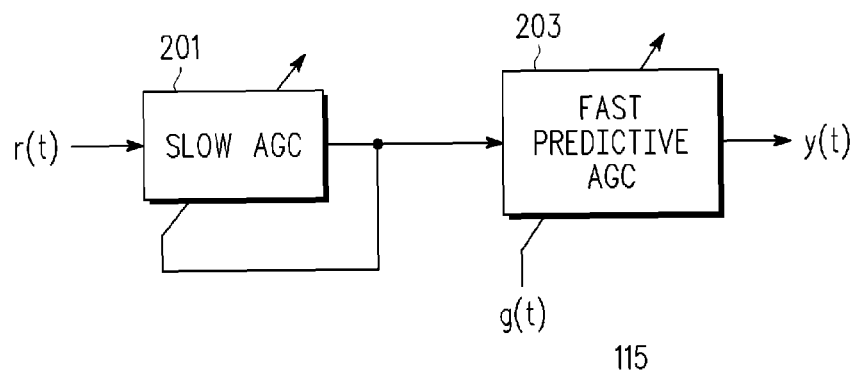

FAST PREDICTIVE AUTOMATIC GAIN CONTROL FOR DYNAMIC RANGE REDUCTION IN WIRELESS COMMUNICATION RECEIVER

BACKGROUND OF THE INVENTION

1. Field of the Invention

This disclosure relates generally to wireless communication receivers, and more specifically, to a system and method for reducing dynamic range using fast predictive automatic gain control.

2. Description of the Related Art

Automatic gain control (AGC) circuits are typically designed to compensate for the slow fading or log-normal shadowing of a received signal. Due to fast fading, such as Rayleigh fading and the like, the accuracy of the analog to digital converter (ADC) in the conventional receiver had to be relatively high to compensate for increased dynamic range. As an example, up to 5 additional bits of precision were needed to compensate for up to 30 decibels (dB) of dynamic range. Each additional bit of the ADC, however, increased power consumption of the conventional radio by a factor of approximately four. It is desired to reduce power consumption of wireless communication devices.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 1 is a block diagram of the receiver portion of a wireless communication system implemented according to an exemplary embodiment;

FIG. 2 is a block diagram of the AGC circuit of FIG. 1 implemented according to an exemplary embodiment;

FIG. 3 is a block diagram of the channel estimation and prediction circuit of FIG. 1 implemented according to an exemplary embodiment;

FIG. 4 is a figurative diagram of the received signal according to one embodiment including known pilot symbols at pilot locations;

FIG. 5 is a more detailed block diagram of the channel predictor of FIG. 3 implemented according to an exemplary embodiment; and FIG. 6 is a flowchart diagram illustrating operation of the wireless communication system of FIG. 1 according to an exemplary embodiment.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

FIG. 1 is a block diagram of the receiver portion of a wireless communication system 100 implemented according to an exemplary embodiment. The system 100 includes a radio 101 with an antenna 102, a variable resolution (VR) analog to digital converter (ADC) 103 and a baseband processor 105. A signal in a wireless channel is received by the antenna 102 and provided to a diplex filter 107, which forwards the received signal (the RX signal) to the input of a band filter 109. The diplex filter 107 also provides a signal generated by the radio 101 (TX signal) to the antenna 102 for transmission. Although the radio 101 may be implemented to transmit signals, the present disclosure primarily concerns the receiver portion of the wireless communication system 100. The band filter 109 filters the RX signal to determine whether the received signal RX is within a selected frequency band of interest. The band filtered RX signal is provided to the input of a low noise amplifier (LNA) 111, which provides an amplified signal to the input of an RX modulator 113. The RX modulator 113 mixes the received signal with a selected frequency level to provide a received signal r(t). The r(t) signal is provided to the input of an automatic gain control (AGC) circuit 115, which adjusts the gain of the received signal by a gain signal g(t) from the baseband processor 105. As described further below, the gain signal g(t) is set to a predetermined initial value and is continuously updated while a signal is being received to minimize variance of the received signal power relative to a target gain level.

A gain-controlled baseband received signal y(t) at the output of the AGC circuit 115 is provided to the input of the ADC 103. It is appreciated that additional components may be provided in the receive path between the RX modulator 113 and the ADC 103, such as, for example, an anti-aliasing low-pass filter or the like. The ADC 103 samples and converts the analog received signal y(t) to a digital or discrete-time received signal y[n], which is provided to respective inputs of a dynamic range determination circuit 119 and a channel estimation and gain prediction circuit 121 within the baseband processor 105. The baseband processor 105 includes other circuitry (not shown) for converting the y[n] signal to information symbols and to convert the symbols into a bitstream containing the transmitted information as understood by those of ordinary skill in the art. In the illustrated embodiment, the ADC 103 has a variable resolution control input receiving a resolution control (RC) signal for controlling the number of resolution bits used to convert y(t) to y[n]. The dynamic range determination circuit 119 monitors the y[n] signal and provides the RC signal to control the resolution of the ADC 103. In one embodiment, the dynamic range determination circuit 119 sets the initial resolution of the ADC 103 to a relatively high resolution (e.g., highest resolution) to ensure detection of low power signals transmitted in the channel. The channel estimation and gain prediction circuit 121 adjusts the g(t) signal to adjust the power level of the y(t) signal towards a target power level. In response, the dynamic range determination circuit 119 adjusts the RC signal to reduce the resolution of the ADC 103 to reduce power consumption. The channel estimation and gain prediction circuit 121 receives the y[n] signal and provides a discrete-time gain signal g[n]. The gain signal g[n] comprises a series of gain values, each for a corresponding signal sample of the received signal y[n]. The g[n] signal is provided to the input of a digital to analog converter (DAC) 123, which converts the g[n] signal to the g(t) signal to set the gain level of the AGC circuit 115.

FIG. 2 is a block diagram of the AGC circuit 115 implemented according to an exemplary embodiment. In the illustrated embodiment, the AGC circuit 115 includes a slow AGC circuit 201 having an input receiving the r(t) signal and an output coupled to the input of a fast predictive AGC circuit 203. The output of the slow AGC circuit 201 is also fed back to its adjust input to perform conventional slow gain adjustment as understood by those of ordinary skill in the art. The AGC circuit 201 is typically designed to compensate for the slow fading (e.g., log-normal shadowing) of the received signal. The fast predictive AGC circuit 203 includes an adjust input receiving the g(t) signal to perform fast predictive gain control as described herein. In one embodiment, the fast predictive AGC circuit 203 multiplies the r(t) signal (gain adjusted by the slow AGC circuit 201) by the gain signal g(t) to provide the y(t) signal. As described further below, the channel estimation and gain prediction circuit 121 uses temporal correlation statistics and estimates the channel power in the next time instance. Using the predicted power level and considering the channel prediction error statistics, the channel estimation and gain prediction circuit 121 controls the g(t) signal to set the gain level of the AGC circuit 115 to minimize the expected dynamic range of the y(t) signal provided to the ADC 103. The resolution of the ADC 103, therefore, is reduced as the gain is adjusted to reduce power consumption of the wireless communication system 100.

The received signal r(t) is a continuous-time analog signal according to the following equation (1):

$$r(t)=h(t)s(t)+v(t) \quad (1)$$

where h(t) is the time-varying complex-valued narrowband wireless fading process representing the "gain" of the wireless channel, s(t) is the complex-valued transmitted signal, and v(t) is a complex Additive White Gaussian Noise (AWGN) process with mean zero and noise variance $\sigma_v^2$. The channel estimation and gain prediction circuit 121 determines the appropriate value of g(t) which is applied to the received signal r(t) in order to minimize the dynamic range of the received signal y(t). The discrete-time received signal y[n], assuming ideal Nyquist sampling, is according to the following equation (2):

$$y[n]=g[n](h[n]s[n]+v[n]) \quad (2)$$

where n is an index value (i.e., n=0, 1, 2, . . . ) such that the square brackets and index n signify the respective equivalent discrete-time sampled signal values.

Figure 3:
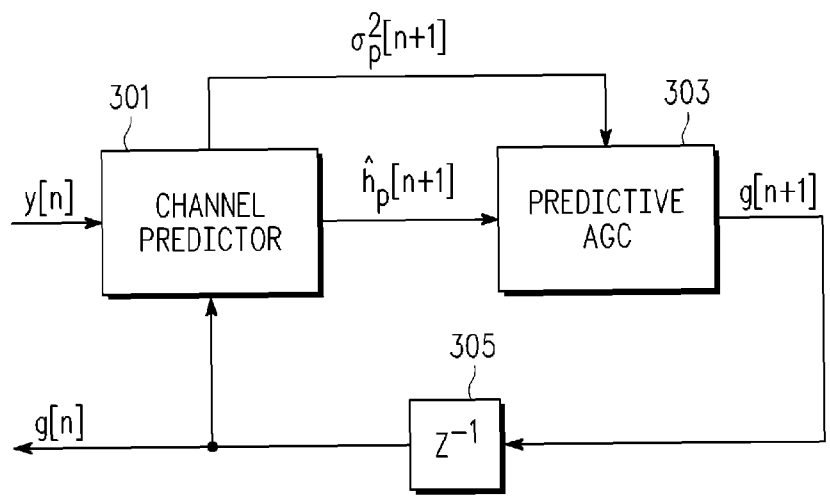

FIG. 3 is a block diagram of the channel estimation and gain prediction circuit 121 implemented according to an exemplary embodiment. The y[n] sample values are provided to an input of a channel predictor 301, which determines corresponding values of the channel gain one symbol ahead, shown as $\hat{h}_P[n+1]$, and which determines corresponding predicted error variance values, shown as $\sigma_P^2[n+1]$, for one symbol ahead. The channel predictor 301 is implemented according to a linear minimum mean-squared error (LMMSE), although other types of channel prediction processes are contemplated. The channel gain values $\hat{h}_P[n+1]$ and the predicted error variance values $\sigma_P^2[n+1]$ are provided to a predictive AGC circuit 303, which determines suitable corresponding gain values g[n+1] that are used to minimize the input dynamic range of the incoming received signal for the next symbol. Each gain value g[n+1] is provided to the input of a memory device 305 (represented as transform function $Z^{-1}$), which outputs the gain values g[n]. The memory device 305 may be implemented as a register or one or a set of flip-flops or a set of latches or the like for temporarily storing each predicted gain value for approximately one symbol time. As shown in FIG. 1, the gain values g[n] are converted to the g(t) signal used to minimize the input dynamic range of the incoming received signal. The gain values g[n] are also provided to another input of the channel predictor 301.

Figure 4:
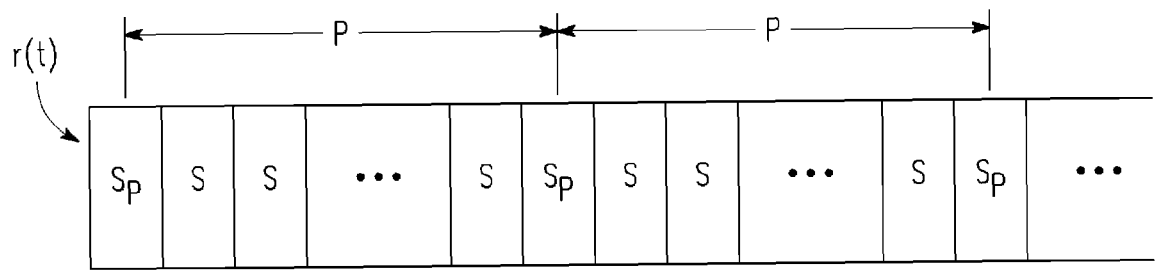

FIG. 4 is a figurative diagram of the r(t) signal according to one embodiment. The r(t) signal is depicted as a sequence of information symbols "S" with pilot symbols $S_P$ inserted between every "P" set of symbols, where P is a positive integer greater than zero. Pilot symbols are known reference or periodic symbols in the transmitted signal. The baseband processor 105 attempts to identify and resolve the information symbols into a bit-stream as previously described. The collective set of pilot symbols, denoted as $s_p[nP]$, are known periodic symbols incorporated within the transmitted signal which may be used to estimate channel gain among other parameters. In one embodiment, the pilot symbols are sent at unit energy. The known pilot symbols, together with the known gain level, enables a least-squares (LS) estimation of the wireless channel at the pilot locations according to the following equation (3):

$$\hat{h}_{LS}[nP] = \frac{y[nP]}{g[nP]s_p[nP]} = h[nP] + \frac{v[nP]}{s_p[nP]} \quad (3)$$

In one embodiment, it is assumed that the pilots are sent at unit energy so that the error term $$\frac{v[nP]}{s_p[nP]}$$

remains AWGN with variance $\sigma_v^2$.

Figure 5:
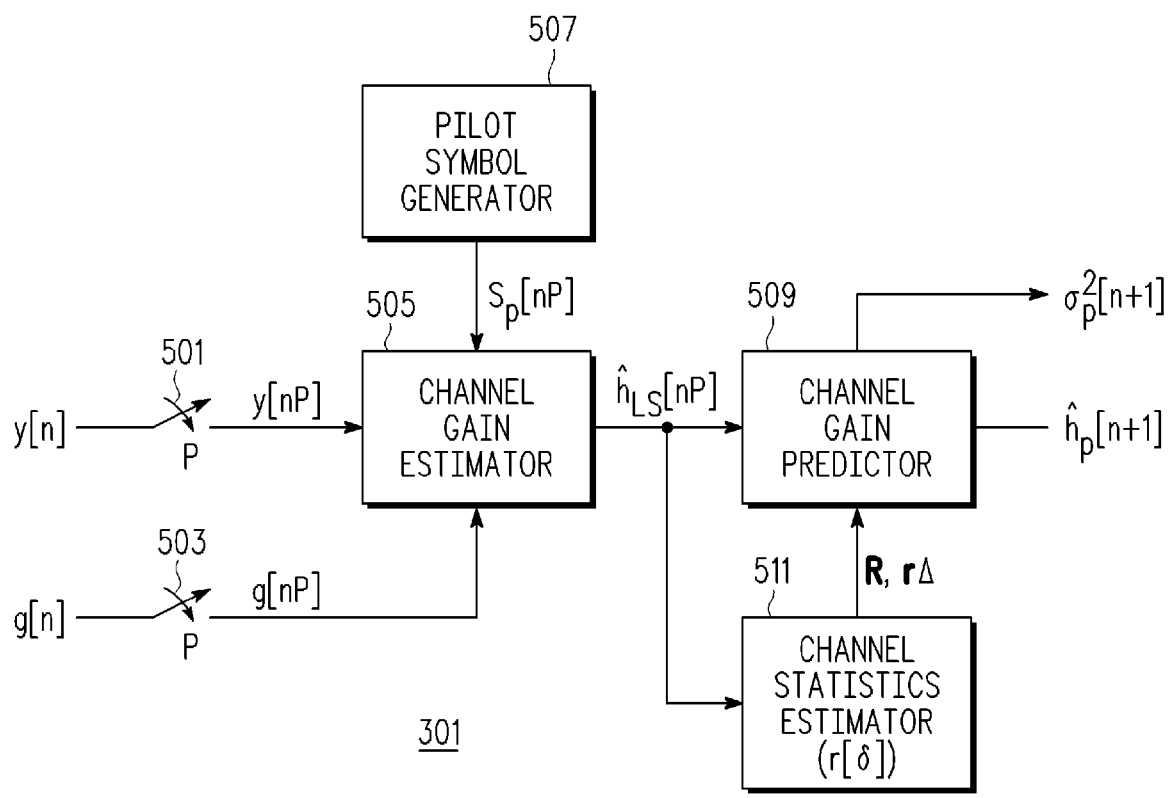

FIG. 5 is a more detailed block diagram of the channel predictor 301 implemented according to an exemplary embodiment. The y[n] signal samples are provided to a down sampler 501, which selects and provides signal samples y[nP] corresponding to the pilot symbols. In a similar manner, the g[n] gain values are provided to another down sampler 503, which selects and provides gain values g[nP] corresponding to the pilot symbols. The y[nP] and g[nP] sample values are provided to respective inputs of a channel gain estimator 505. A pilot symbol generator 507 provides corresponding known pilot symbols $s_p[nP]$ to another input of the channel gain estimator 505. The channel gain estimator 505 operates according to equation (3) and provides least-squares channel gain estimates $\hat{h}_{LS}[nP]$ at the pilot locations to respective inputs of a channel gain predictor 509 and a channel statistics estimator 511. The channel statistics estimator 511 receives the channel gain estimates and estimates a temporal correlation function r[δ] and provides estimated values for a temporal autocorrelation matrix R and estimated values for a temporal cross-correlation vector rΔ to another input of the channel gain predictor 509. As used herein, a signal descriptor in bold text represents multiple signal values, such as a vector or a matrix or the like. The channel gain predictor 509 receives the channel power estimates $\hat{h}_{LS}[nP]$ and estimated temporal correlation statistics values and provides least-squares estimated predicted values of the channel gain $\hat{h}_p[n+1]$ and predicted error variance values $\sigma_p^2[n+1]$ to the predictive AGC circuit 303.

In the illustrated embodiment, the gain level of the channel one symbol ahead of the current symbol, or $\hat{h}_p[n+1]$, is predicted using LMMSE by performing a linear combination of the available current and previous L least-squares estimates of the channel according to the following equation (4):

$$\hat{h}_p[n+1] = \hat{h}_p[mP+\Delta] = \sum_{l=0}^{L-1} w_\Delta[l]\hat{h}_{LS}[(m-l)P] \quad (4)$$

where $m=\lfloor n/P \rfloor$ (in which the brackets "$\lfloor \ \rfloor$" denote the floor operation, e.g., contents rounded down to nearest integer), $\Delta=n+1-mP$, $w_\Delta[l]$ defines the filter coefficients according to a weighting function, and L is a positive integer determining the filter length, i.e., the number of filter coefficients. The parameter "$\Delta$" represents an index to the intermediate symbols between the pilot symbols. The LMMSE predictor coefficients are determined according to the following equation (5):

$$w_\Delta = (R + \sigma_v^2 I)^{-1} r_\Delta \quad (5)$$

in which $w_\Delta$ is an L-length prediction coefficients vector, R is an L×L temporal autocorrelation matrix as further described below, I is the L×L identity matrix as known to those skilled in the art (in which main diagonal values of matrix are unity values and remaining matrix values are zero), the power notation "−1" denotes matrix inversion, and $r_\Delta$ is an L-length temporal cross-correlation vector as further described below. The prediction coefficients vector $w_\Delta$ may be written according to the following equation (6):

$$w_\Delta = [w_\Delta[0], \ldots, w_\Delta[L-1]]^T \quad (6)$$

in which the power notation "T" denotes the transpose function as understood by those skilled in the art. The temporal autocorrelation matrix R may be written according to the following equation (7):

$$R = \begin{bmatrix} r[0] & r^*[P] & \ldots & r^*[(L-1)P] \\ r[P] & r[0] & \ddots & \vdots \\ \vdots & \ddots & \ddots & r^*[P] \\ r[(L-1)P] & \ldots & r^*[P] & r[0] \end{bmatrix} \quad (7)$$

in which the asterisk "*" denotes the conjugate function. The temporal cross-correlation vector $r_\Delta$ may be written according to the following equation (8):

$$r_\Delta = [r[\Delta], r[P+\Delta], \ldots, r[(L-1)P+\Delta]]^T \quad (8)$$

The temporal correlation function $r[\delta]$ is defined according to the following equation (9):

$$r[\delta] = E[h[n]h^*[n+\delta]] \quad (9)$$

in which "E" denotes the expectation function. In the illustrated embodiment, the temporal correlation function $r[\delta]$ is estimated using a block of N least-squares channel estimates to determine temporal correlation estimated values at the pilot location spacing P, or $r[0], r[P], r[2P], \ldots, r[LP]$ according to the following equation (10):

$$\hat{r}[mP] = \sum_{i=0}^{N-L-1} \hat{h}_{LS}[iP]\hat{h}_{LS}^*[(i+m)P] \quad (10)$$

where $m=0, \ldots, L$. The estimates for $r[\Delta], r[P+\Delta], \ldots, r[(L-1)P+\Delta]$ can then be determined by interpolating between the $\hat{r}[mP]$ values such as by low pass interpolation or the like. Other methods of correlation function estimation and interpolation are known and contemplated. The predicted error variance values are determined according to the following equation (11):

$$\sigma_p^2[n+1] = r[0] - r_\Delta^H (R + \sigma_v I)^{-1} r_\Delta \quad (11)$$

where the power notation "H" is the Hermitian transpose as known to those skilled in the art. In the illustrated embodiment, the channel statistics estimator 511 determines and provides the estimated values or $r[0], r[P], r[2P], \ldots, r[LP]$ and corresponding conjugate values or $r^*[P], r^*[2P], \ldots, r^*[LP]$ (collectively represented as matrix R in FIG. 5), and provides the estimated values $r[\Delta], r[P+\Delta], \ldots, r[(L-1)P+\Delta]$ (collectively represented as the vector $r\Delta$ in FIG. 5) to the channel gain predictor 509. The channel gain predictor 509 operates according to equations (5)-(8) using the estimated values for R and $r\Delta$ to determine the values of the vector $w\Delta$, and further uses the values of the vector $w\Delta$ and the channel power estimates $\hat{h}_{LS}[nP]$ to determine the predicted channel gain values $\hat{h}_p[n+1]$ in accordance with equation (4) in the illustrated embodiment. Also, the channel gain predictor 509 operates according to equation (11) to determine the predicted error variance values $\sigma_p^2[n+1]$.

The predictive AGC circuit 303 uses the predicted channel gain values $\hat{h}_p[n+1]$ and the predicted error variance values $\sigma_p^2[n+1]$ to provide the predicted gain values g[n+1]. The predicted gain values g[n+1] are provided through the memory device 305 to provide the g[n] gain values, which are converted to the g(t) signal used to minimize the dynamic gain range of the ADC 103. In one embodiment, the variance of the received signal power is minimized with respect to a target power level for the wireless communication system 100, denoted as $\gamma$, according to the following equation (12):

$$\min_g E[(\gamma - |y|^2)^2 \mid \hat{h}_p] = \min_g E[(\gamma - g^2|hs+v|^2)^2 \mid \hat{h}_p] \quad (12)$$
$$= \min_\alpha E[(\gamma - \alpha|hs+v|^2)^2 \mid \hat{h}_p]$$

in which the index "n+1" is dropped for brevity, the variable g is changed according to $\alpha g^2$, and "min" denotes the minimum function, and $$E[\cdot \mid \hat{h}_p]$$

is the conditional expected value of the argument given the predicted channel value $\hat{h}_p$. Hence, equation (12) seeks to find the optimal value for $\alpha$ such that the conditional variance of the received signal power $\alpha|hs+v|_2$ given the predicted channel value $\hat{h}_p$ is minimized. The square value within the expectation function E is expanded, the derivative is taken with respect to $\alpha$, and the result is set to zero to determine an optimal value for $\alpha$, denoted $\alpha_{OPT}$, according to the following equation (13):

$$\alpha_{OPT} = \gamma \frac{E[|hs+v|^2 \mid \hat{h}_p]}{E[|hs+v|^4 \mid \hat{h}_p]} \quad (13)$$

If it is assumed that the transmitted symbols have normalized transmit energy ($E[s^2]=1$), and that the random variables of the channel gain h, the transmitted symbols s, and the noise v are independent of each other, equation (13) is simplified according to the following equation (14):

$$\alpha_{OPT} = \gamma \frac{E[|h|^2 \mid \hat{h}_p] + \sigma_v^2}{E[|h|^4 \mid \hat{h}_p] + 2\sigma_v^2 E[|h|^2 \mid \hat{h}_p] + \sigma_v^4} \quad (14)$$

If it is further assumed that each realization of the channel gain h is modeled as the predicted value $\hat{h}_p$ perturbed by a zero-mean complex Gaussian prediction error term with $v_p$ with variance given by the prediction error $\sigma_p^2$ according to the following equation (15):

$$h = \hat{h}_p + v_p \quad (15)$$

then equation (14) may further be simplified such that the random variable $h|\hat{h}_p$ is complex Gaussian with non-zero mean given by the predicted channel value $\hat{h}_p$ and variance $\sigma_p^2$. These assumptions make $h^2$ given $\hat{h}_p$ a non-central Chi-squared random variable with two degrees of freedom and non-centrality parameter $\hat{h}_p^2$ whose first two raw moments are given according to the following equations (16) and (17):

$$E[|h|^2 \mid \hat{h}_p] = |\hat{h}_p|^2 + \sigma_p^2 \quad (16)$$

$$E[|h|^4 \mid \hat{h}_p] = |\hat{h}_p|^4 + 4\sigma_p^2 |\hat{h}_p|^2 + 2\sigma_p^4 \quad (17)$$

The results of equations (16) and (17) are substituted into corresponding parameters of equation (14) to obtain a simplified expression for $\Delta_{OPT}$ according to the following equation (18):

$$\alpha_{OPT} = \gamma \frac{|\hat{h}_p|^2 + \sigma_p^2 + \sigma_v^2}{\left(|\hat{h}_p|^2 + \sigma_p^2 + \sigma_v^2\right)^2 + 2\sigma_p^2 |\hat{h}_p|^2 + \sigma_p^4} \quad (18)$$

In a practical system, a maximum allowable gain value $g_{MAX}$ is imposed on the fast predictive AGC circuit 115 due to amplifier limitations, so that the g[n+1] values are determined according to the following equation (19):

$$g[n+1] = \min\left(g_{MAX}, \sqrt{\gamma \frac{|\hat{h}_p[n+1]|^2 + \sigma_p^2[n+1] + \sigma_v^2}{\left(|\hat{h}_p[n+1]|^2 + \sigma_p^2[n+1] + \sigma_v^2\right)^2 + 2\sigma_p^2[n+1]|\hat{h}_p[n+1]|^2 + \sigma_p^4[n+1]}}\right) \quad (19)$$

The predictive AGC circuit 303 operates according to equation (19) to generate the g[n+1] gain values. The g[n+1] values are delayed or temporarily stored for a symbol time to provide the g[n] values, which are then provided to the DAC 123 to generate the g(t) signal used to amplify the r(t) signal via the fast predictive AGC circuit 203.

Figure 6:
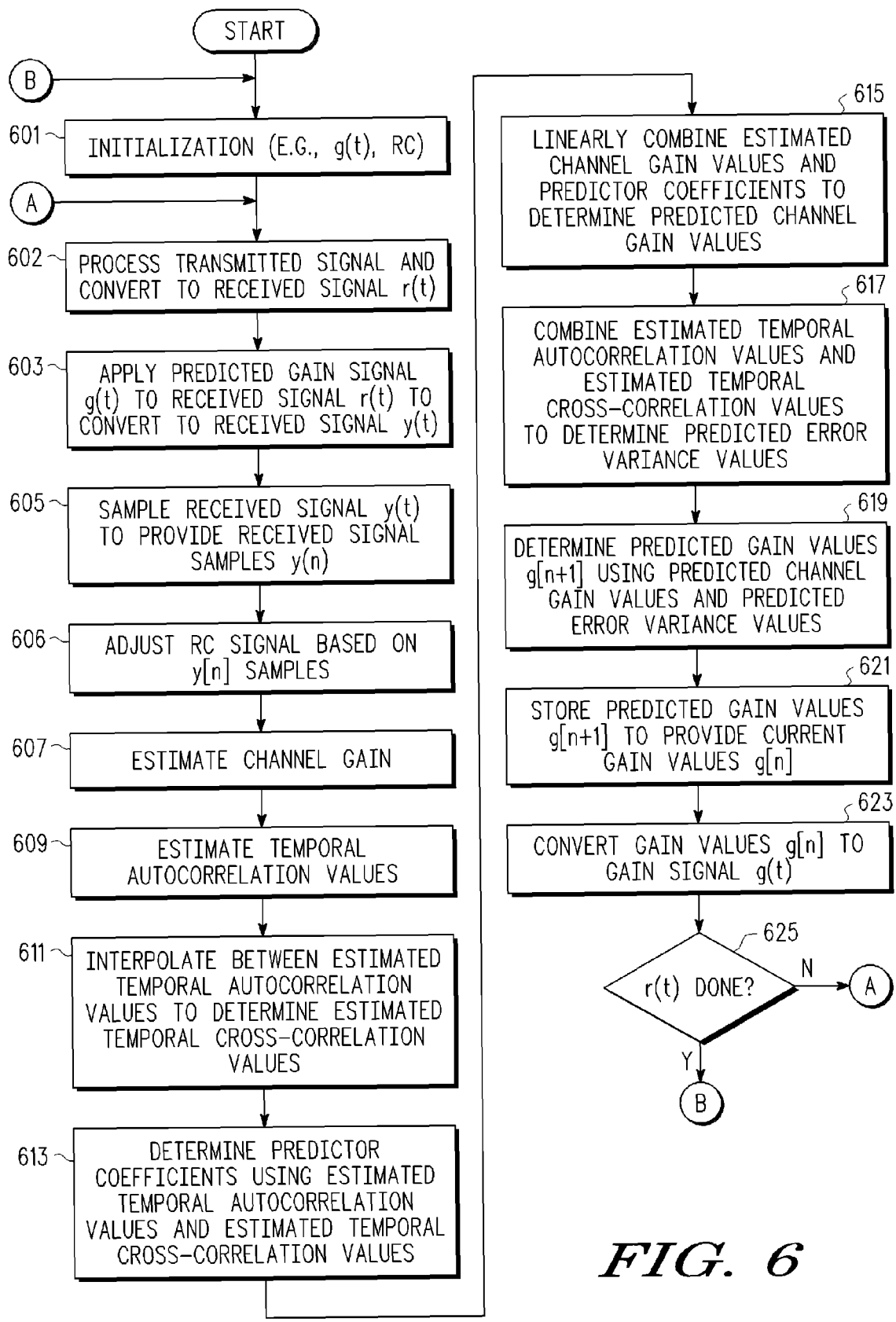

FIG. 6 is a flowchart diagram illustrating operation of the wireless communication system 100 according to an exemplary embodiment. Various blocks and corresponding functions may be re-ordered or reorganized depending upon the particular implementation. At a first block 601, initialization is performed including initialization of parameters for receiving a signal. For example, the g(t) signal may be set to an initial gain value or otherwise adjusted based on previously received signals. Also, the RC signal may be set to an initial value for setting the ADC 103 to an initial resolution. At next block 602, the wireless communication system 100 receives and processes a signal s(t) transmitted through the wireless medium and received by the radio 101 into the received signal r(t). As previously described, such processing includes various filtering, amplifying and modulation functions to provide the received signal r(t). At next block 603, the gain signal g(t) is applied to the received signal r(t) to generate the received signal y(t). In the illustrated embodiment, the fast predictive AGC circuit 203 amplifies the received signal r(t) by the gain signal g(t) to provide the received signal y(t). In one embodiment, the initial value of g(t) is set to an initial gain level to ensure detection of the transmitted signal by the radio 101. In another embodiment, the initial value of g(t) is adjusted based on the last signal received by the radio 101. As the received signal is processed through the wireless communication system 100, the predicted gain signal g(t) converges towards a suitable gain level to properly compensate for the channel gain in order to reduce or otherwise minimize the variance of the power level of the received signal as compared to a target power level.

At next block 605, the received signal y(t) is sampled to provide received signal samples y[n]. In the illustrated embodiment, the ADC 103 samples according to Nyquist criterion to convert the analog signal y(t) to the received signal samples y[n] for processing by the baseband processor 105. At next block 606, the RC signal is adjusted based on the signal samples y[n]. It is noted that the dynamic range determination circuit 119 may operate independently with respect to the channel estimation and gain prediction circuit 121. In general, as the g(t) signal converges to the target gain, the RC signal is adjusted to reduce resolution of the ADC 103 thereby reducing power consumption. At next block 607, the channel gain h is estimated using the signal samples y[n]. In the illustrated embodiment, channel estimation and prediction is performed within the channel predictor 301. As shown in FIG. 4, the received signal r(t) includes known pilot symbols at known pilot locations (e.g., spacing of every P symbols) to enable an estimation of the channel gain. In the illustrated embodiment, the channel gain estimator 505 uses the signal samples y[nP] and corresponding gain values g[nP] at the pilot locations along with the known pilot symbols $s_p$[nP] and employs a least-squares estimate to determine estimated channel gain values $\hat{h}_{LS}$[nP] at the pilot locations in accordance with equation (3) as previously described.

At following blocks 609, 611, 613, 615 and 617, temporal correlation statistics are applied to the estimated channel gain to predict channel gain at a subsequent time instance. In the illustrated embodiment, LMMSE prediction is applied to the estimated channel gain values to perform the prediction. At blocks 609 and 611, a temporal correlation function is estimated using the estimated channel gain values. At block 609, temporal autocorrelation values are estimated first, and at block 611, estimated cross-correlation values are determined by interpolating between the temporal autocorrelation values. In the illustrated embodiment, the channel statistics estimator 511 operates according to equation (10) to determine the estimated temporal autocorrelation values (block 609) and further performs the interpolation to determine the estimated cross-correlation values (block 611). At next block 613, predictor coefficients are determined using the estimated temporal autocorrelation values and the estimated cross-correlation values. At next block 615, the estimated channel gain values are linearly combined with the predictor coefficients to determine the predicted channel gain values. At next block 617, the estimated temporal autocorrelation values and the estimated cross-correlation values are combined to determine the predicted error variance values. In the illustrated embodiment, the channel gain predictor 509 receives the temporal correlation values from the channel statistics estimator 511 and operates according to equations (5)-(8) to determine the predictor coefficients wΔ. The channel gain predictor 509 then operates according to equations (4) and (6) to linearly combine the predictor coefficients with the estimated channel gain values to provide the predicted channel gain values $\hat{h}_p[n+1]$. The channel gain predictor 509 further operates in accordance with equation (11) to determine the predicted error variance values $\sigma_p^2[n+1]$ by combining the estimated temporal autocorrelation values and the estimated cross-correlation values.

At next block 619, the predicted channel gain values and the predicted error variance values are used to determine the predicted gain values g[n+1]. In the illustrated embodiment, the predictive AGC circuit 303 operates in accordance with equation (19) using the predicted channel gain values $\hat{h}_p[n+1]$, the predicted error variance values $\sigma_p^2[n+1]$, a predetermined target gain value γ and the maximum gain value $g_{MAX}$ to determine predicted gain values g[n+1]. The predicted gain values g[n+1] are calculated to minimize the difference between the estimated power of the received signal (as attenuated through the channel based on channel gain) and the target gain. The target value γ and maximum gain value $g_{MAX}$ are determined based on the particular implementation of the wireless communication system 100 including the implementations of the AGC circuit 115, the ADC 103, and baseband processor 105. At next block 621, the predicted gain values g[n+1] are stored for a signal sample time (used by the ADC 103) to provide the "current" gain values g[n], such as illustrated by the memory device 305. In one embodiment, the memory device 305 is synchronized with the ADC 103 and the DAC 123 to synchronize between the predicted values, the current values, and the applied gain values. At next block 623, the gain values g[n] are converted to the gain signal g(t), such as illustrated by the DAC 123. The determined gain signal g(t) is applied to the received signal r(t) to convert to the received signal y(t) at block 603. At next block 625, it is queried whether the signal r(t) currently being received is completed. If not, operation loops back to block 602 and operation continues to loop between blocks 602-625 while the signal is being received. In general, each loop iteration corresponds to each received signal sample y[n]. When the current signal r(t) is completed as determined at block 625, operation returns to block 601 to prepare for the next signal.

The channel estimation and gain prediction circuit 121 has been described according to a single carrier communication system. The concepts described herein may be applied in similar manner to a multi-carrier communication system. In an orthogonal frequency-division multiplexing (OFDM) system operating in a frequency selective multi-path fading channel, the received signal within the kth OFDM symbol may be modeled according to the following equation (20):

$$y[n] = g[k]\left(\sum_{l=1}^{L} h[l,k]s[n-N_l] + v[n]\right) \quad (20)$$

in which $N_{symb}k \le n \le N_{symb}(k+1)$ and where h[l,k], l=1,..., L are the complex channel taps that are assumed statistically independent across taps and constant across the kth OFDM symbol, g[k] is the gain value also assumed constant across the symbol, Nl is the discretized time delay for the lth tap, and $N_{symb}$ is the OFDM symbol length. The $N_{symb}$ samples are collected into a vector y[k] according to the following equation (21):

$$y[k]=[y[N_{symb}k],\ldots,y[N_{symb}(k+1)-1]]^T \quad (21)$$

and the received signal power for an OFDM symbol is given as the squared norm of the vector y[k], i.e., $\|y[k]\|^2$. The channel predictor 301 is modified to predict each of the L taps that characterize the channel one OFDM symbol ahead using pilot signals in both frequency and time dimensions, giving a predicted channel value per tap l $\hat{h}_p[l,k+1]$ with the corresponding predicted error variances per tap $\hat{\sigma}_p^2[l,k+1]$, which are collected into vectors according to the following equations (22) and (23):

$$\hat{h}_p[k+1]=[\hat{h}_p 1,k+1],\ldots,\hat{h}_p[L,k+1]]^T \quad (22)$$

$$\hat{\sigma}_p[k+1]=[\hat{\sigma}_p^2[1,k+1],\ldots,\hat{\sigma}_p^2[L,k+1]]^T \quad (23)$$

The equations (12)-(19) are modified by replacing the signal power terms $y^2$ with the squared norm terms $y^2$, and similarly the channel power terms $h^2$ and $\hat{h}_p^2$ with the squared norm counterparts $h^2$ and $\|\hat{h}_p\|^2$, respectively.

A method of fast predictive automatic gain control according to one embodiment includes estimating channel gain applied to a received signal, predicting channel gain at a subsequent time by applying temporal correlation statistics to the estimated channel gain, determining a predicted receiver gain which reduces variance between the predicted channel gain and a predetermined target power level, and applying the predicted receiver gain to the received signal. In one embodiment, predicting channel gain may include applying linear minimum mean-squared error (LMMSE) prediction to the estimated channel gain. In another embodiment, the method may include predicting error variance at the subsequent time by applying the temporal correlation statistics to the estimated channel gain and combining the predicted channel gain and the predicted error variance.

The method may include estimating channel gain of pilot symbols within the received signal, estimating a temporal correlation function using the estimated channel gain of the pilot symbols, and determining predicted channel gain using the estimated channel gain of the pilot symbols and the estimated temporal correlation function. In one embodiment, the method may further include using estimated channel gain values of the pilot symbols to determine temporal autocorrelation values, interpolating between the temporal autocorrelation values to determine temporal cross-correlation values, determining predictor coefficients using the temporal autocorrelation values and the temporal cross-correlation values, and linearly combining the estimated channel gain values of the pilot symbols and the predictor coefficients to determine predicted channel gain values.

The method may further include combining the temporal autocorrelation values and the temporal cross-correlation values to determine corresponding predicted error variance values, and combining the predicted channel gain values and the predicted error variance values to determine corresponding predicted receiver gain values. The method may further include sampling the received signal to provide signal samples, down sampling the signal samples at pilot locations to provide pilot symbol samples, storing the predicted receiver gain values to provide current gain values, down sampling the current gain values at the pilot locations to provide pilot gain values, and combining the pilot symbol samples, the pilot gain values, and known pilot symbols. The method may further include converting the current gain values to a gain signal, and amplifying the received signal by the gain signal.

A channel estimation and gain prediction system for a receiver for fast predictive automatic gain control according to one embodiment includes a channel gain estimator, a channel gain predictor, a predictive gain controller, and a gain circuit. The channel gain estimator estimates channel gain applied to a received signal and determines an estimated channel gain. The channel gain predictor predicts channel gain at a subsequent time by applying temporal autocorrelation statistics to the estimated channel gain to provide a predicted channel gain. The predictive gain controller uses the predicted channel gain to determine a predicted receiver gain to reduce variance between the predicted channel gain and a target power level. The gain circuit applies the predicted receiver gain to the received signal.

In one embodiment, the channel gain predictor determines a predicted error variance, where the predictive gain controller uses the predicted channel gain and the predicted error variance to determine the predicted receiver gain. In another embodiment, the channel gain estimator determines a least-squares estimate of the channel gain of known pilot symbols within the received signal. In another embodiment, the channel gain predictor applies linear minimum mean-squared error (LMMSE) prediction to the estimated channel gain to determine the predicted channel gain.

The channel estimation and gain prediction system may further include a variable range analog to digital converter (ADC) and a dynamic range determination circuit. The variable resolution ADC has a first input receiving the received signal, a second input receiving a resolution control signal, and an output providing received signal samples. The dynamic range determination circuit has an input receiving the received signal samples and an output providing the resolution control signal. The dynamic range determination circuit controls the resolution control signal to reduce resolution of the variable resolution ADC based on dynamic range of the received signal samples.

The channel estimation and gain prediction system may further include a memory device and a digital to analog converter (DAC). The predictive gain controller has an output providing predicted receiver gain values. The memory device has an input receiving the predicted receiver gain values and an output providing current receiver gain values. The DAC has an input receiving the current receiver gain values and an output providing a gain signal. In this case, the gain circuit has a first input receiving the received signal, a second input receiving the gain signal, and an output providing a gain-controlled received signal.

The received signal may include known periodic symbols. In one embodiment the channel estimation and gain prediction system may further include an ADC having an input receiving the received signal and an output providing received signal samples, and a memory device having an input receiving the predicted receiver gain and an output providing current receiver gain values. In this case the channel gain estimator has a first input receiving the received signal samples, a second input receiving the current receiver gain values, and an output providing estimated channel gain values based on the known periodic symbols, the received signal samples at periodic symbol locations, and the current receiver gain values corresponding to the periodic symbol locations.

The channel estimation and gain prediction system may further include a channel statistics estimator having an input receiving the estimated channel gain and an output providing temporal correlation values. In this case the channel gain predictor has a first input receiving the estimated channel gain, a second input receiving the temporal correlation values, and a first output providing predicted channel gain values based on the estimated channel gain and the temporal correlation values. The channel gain predictor may further have a second output providing predicted error variance values. The predictive gain controller may have a first input receiving the predicted channel gain values, a second input receiving the predicted error variance values, and an output providing predicted receiver gain values.

A receiver according to another embodiment includes a radio, an ADC, a channel estimation and gain prediction circuit, and a DAC. The radio receives and converts a transmitted signal into a received signal and amplifies the received signal by a predictive gain signal to provide a gain-controlled received signal. The ADC has an input receiving the gain-controlled received signal and an output providing received signal samples. The channel estimation and gain prediction circuit includes a channel predictor, a predictive gain controller, and a memory device. The channel predictor has a first input receiving the received signal samples, a second input receiving current gain values, a first output providing predictive channel gain values and a second output providing predictive error variance values. The predictive channel gain values and the predictive error variance values are determined using a temporal correlation function. The predictive gain controller has a first input receiving the predictive channel gain values, a second input receiving the predictive error variance values, and an output providing predictive gain values. The memory device has an input receiving the predictive gain values and an output providing the current gain values. The DAC has an input receiving the current gain values and an output providing the predictive gain signal.

The ADC of the radio may be a variable resolution ADC having a resolution adjust input. In this case, the receiver may further include a dynamic range determination circuit having an input receiving the received signal samples and an output providing a resolution control signal to the adjust input of the variable resolution ADC. The dynamic range determination circuit controls the resolution control signal to reduce resolution of the variable resolution ADC based on dynamic range of the received signal samples.

The channel predictor of the receiver may include a channel gain estimator, a channel statistics estimator, and a channel gain predictor. The channel gain estimator has a first input receiving the received signal samples, a second input receiving the current gain values, a third input receiving known pilot symbols, and an output providing channel gain estimate values. The channel statistics estimator has an input receiving the channel gain estimate values and an output providing temporal correlation values. The channel gain predictor has a first input receiving the channel gain estimate values, a second input receiving the temporal correlation values, a first output providing the predictive channel gain values and a second output providing the predictive error variance values.

Although the invention is described herein with reference to specific embodiments, various modifications and changes can be made without departing from the scope of the present invention as set forth in the claims below. For example, the illustrated embodiment shows prediction one symbol ahead where it is understood that prediction may be performed for other future times, such as up to any number of future symbol times. The present invention is illustrated for a single carrier system but applies to multiple carrier systems. Although the illustrated embodiment shows a variable resolution ADC, embodiments employing a fixed resolution ADC are contemplated as well. It should be understood that all circuitry or logic or functional blocks described herein may be implemented either in silicon or another semiconductor material or alternatively by software code representation of silicon or another semiconductor material. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A method of fast predictive automatic gain control, comprising:
   estimating channel gain applied to a received signal;
   predicting channel gain at a subsequent time by applying temporal correlation statistics to the estimated channel gain;
   predicting error variance at the subsequent time by applying the temporal correlation statistics to the estimated channel gain;
   determining a predicted receiver gain which reduces variance between the predicted channel gain and a predetermined target power level, wherein said determining a predicted receiver gain comprises combining the predicted channel gain and the predicted error variance; and
   applying the predicted receiver gain to the received signal.

2. The method of claim 1, wherein said predicting channel gain comprises applying linear minimum mean-squared error (LMMSE) prediction to the estimated channel gain.

3. The method of claim 1, wherein:
   said estimating channel gain comprises estimating channel gain of pilot symbols within the received signal; and
   wherein said predicting channel gain comprises:
      estimating a temporal correlation function using the estimated channel gain of the pilot symbols; and
      determining predicted channel gain using the estimated channel gain of the pilot symbols and the estimated temporal correlation function.

4. The method of claim 3, wherein:
   said estimating a temporal correlation function comprises:
      using estimated channel gain values of the pilot symbols to determine temporal autocorrelation values; and
      interpolating between the temporal autocorrelation values to determine temporal cross-correlation values; and
   wherein said determining predicted channel gain comprises:
      determining predictor coefficients using the temporal autocorrelation values and the temporal cross-correlation values; and
      linearly combining the estimated channel gain values of the pilot symbols and the predictor coefficients to determine predicted channel gain values.

5. The method of claim 4, further comprising:
   combining the temporal autocorrelation values and the temporal cross-correlation values to determine corresponding predicted error variance values; and
   wherein said determining a predicted receiver gain comprises combining the predicted channel gain values and the predicted error variance values to determine corresponding predicted receiver gain values.

6. The method of claim 5, further comprising:
   sampling the received signal to provide signal samples;
   down sampling the signal samples at pilot locations to provide pilot symbol samples;
   storing the predicted receiver gain values to provide current gain values;
   down sampling the current gain values at the pilot locations to provide pilot gain values; and
   said estimating channel gain of the pilot symbols comprising combining the pilot symbol samples, the pilot gain values, and known pilot symbols.

7. The method of claim 6, further comprising:
   converting the current gain values to a gain signal; and
   wherein said applying the predicted receiver gain to the received signal comprises amplifying the received signal by the gain signal.

8. A channel estimation and gain prediction system for a receiver for fast predictive automatic gain control, comprising:
   a channel gain estimator which estimates channel gain applied to a received signal and which determines an estimated channel gain;
   a channel gain predictor which predicts channel gain at a subsequent time by applying temporal autocorrelation statistics to said estimated channel gain to provide a predicted channel gain, and wherein said channel gain predictor determines a predicted error variance;
   a predictive gain controller which uses said predicted channel gain and said predicted error variance to determine a predicted receiver gain to reduce variance between said predicted channel gain and a target power level; and
   a gain circuit which applies said predicted receiver gain to said received signal.

9. The channel estimation and gain prediction system of claim 8, wherein said channel gain estimator determines a least-squares estimate of the channel gain of known pilot symbols within said received signal.

10. The channel estimation and gain prediction system of claim 8, wherein said channel gain predictor applies linear minimum mean-squared error (LMMSE) prediction to said estimated channel gain to determine said predicted channel gain.

11. The channel estimation and gain prediction system of claim 8, further comprising:
   a variable resolution analog to digital converter (ADC) having a first input receiving said received signal, a second input receiving a resolution control signal, and an output providing received signal samples; and
   a dynamic range determination circuit having an input receiving said received signal samples and an output providing said resolution control signal;
   wherein said dynamic range determination circuit controls said resolution control signal to reduce resolution of said variable resolution ADC based on dynamic range of said received signal samples.

12. The channel estimation and gain prediction system of claim 8, further comprising:
   said predictive gain controller having an output providing predicted receiver gain values;
   a memory device having an input receiving said predicted receiver gain values and an output providing current receiver gain values;
   a digital to analog converter having an input receiving said current receiver gain values and an output providing a gain signal; and
   wherein said gain circuit has a first input receiving said received signal, a second input receiving said gain signal, and an output providing a gain-controlled received signal.

13. The channel estimation and gain prediction system of claim 8, further comprising:
said received signal comprising known periodic symbols;
an analog to digital converter (ADC) having an input receiving said received signal and an output providing received signal samples;
a memory device having an input receiving said predicted receiver gain and an output providing current receiver gain values;
wherein said channel gain estimator has a first input receiving said received signal samples, a second input receiving said current receiver gain values, and an output providing estimated channel gain values based on said known periodic symbols, said received signal samples at periodic symbol locations, and said current receiver gain values corresponding to said periodic symbol locations.

14. A channel estimation and gain prediction system for a receiver for fast predictive automatic gain control, comprising:
a channel gain estimator which estimates channel gain applied to a received signal and which determines an estimated channel gain;
a channel gain predictor which predicts channel gain at a subsequent time by applying temporal autocorrelation statistics to said estimated channel gain to provide a predicted channel gain;
a predictive gain controller which uses said predicted channel gain to determine a predicted receiver gain to reduce variance between said predicted channel gain and a target power level;
a gain circuit which applies said predicted receiver gain to said received signal;
a channel statistics estimator having an input receiving said estimated channel gain and an output providing temporal correlation values; and
wherein said channel gain predictor has a first input receiving said estimated channel gain, a second input receiving said temporal correlation values, and a first output providing predicted channel gain values based on said estimated channel gain and said temporal correlation values.

15. The channel estimation and gain prediction system of claim 14, wherein said channel gain predictor has a second output providing predicted error variance values.

16. The channel estimation and gain prediction system of claim 15, wherein said predictive gain controller has a first input receiving said predicted channel gain values, a second input receiving said predicted error variance values, and an output providing predicted receiver gain values.

17. A receiver, comprising:
a radio which receives and converts a transmitted signal into a received signal and which amplifies said received signal by a predictive gain signal to provide a gain-controlled received signal;
an analog to digital converter (ADC) having an input receiving said gain-controlled received signal and an output providing received signal samples;
a channel estimation and gain prediction circuit, comprising:
a channel predictor having a first input receiving said received signal samples, a second input receiving current gain values, a first output providing predictive channel gain values and a second output providing predictive error variance values, wherein said predictive channel gain values and said predictive error variance values are determined using a temporal correlation function;
a predictive gain controller having a first input receiving said predictive channel gain values, a second input receiving said predictive error variance values, and an output providing predictive gain values; and
a memory device having an input receiving said predictive gain values and an output providing said current gain values; and
a digital to analog converter (DAC) having an input receiving said current gain values and an output providing said predictive gain signal.

18. The receiver of claim 17, further comprising:
said ADC comprising a variable resolution ADC having a resolution adjust input; and
a dynamic range determination circuit having an input receiving said received signal samples and an output providing a resolution control signal to said adjust input of said variable resolution ADC;
wherein said dynamic range determination circuit controls said resolution control signal to reduce resolution of said variable resolution ADC based on dynamic range of said received signal samples.

19. The receiver of claim 17, wherein said channel predictor comprises:
a channel gain estimator having a first input receiving said received signal samples, a second input receiving said current gain values, a third input receiving known pilot symbols, and an output providing channel gain estimate values;
a channel statistics estimator having an input receiving said channel gain estimate values and an output providing temporal correlation values; and
a channel gain predictor having a first input receiving said channel gain estimate values, a second input receiving said temporal correlation values, a first output providing said predictive channel gain values and a second output providing said predictive error variance values.

* * * * *